(12) United States Patent
Chen et al.

(10) Patent No.: US 11,150,293 B1
(45) Date of Patent: Oct. 19, 2021

(54) HORIZONTAL PROBING FIXTURE

(71) Applicants: Kuan-Hung Chen, Taichung (TW); Li-Cheng Richard Zai, Taipei (TW)

(72) Inventors: Kuan-Hung Chen, Taichung (TW); Li-Cheng Richard Zai, Taipei (TW)

(*) Notice: Subject to any disclaimer, the term of this patent is extended or adjusted under 35 U.S.C. 154(b) by 0 days.

(21) Appl. No.: 16/929,179

(22) Filed: Jul. 15, 2020

(51) Int. Cl.
*G01R 31/28* (2006.01)
*H05K 1/02* (2006.01)

(52) U.S. Cl.
CPC ....... *G01R 31/2808* (2013.01); *H05K 1/0268* (2013.01)

(58) Field of Classification Search
CPC . G01R 31/2808; H05K 1/0268; H05K 3/1216
See application file for complete search history.

(56) References Cited

U.S. PATENT DOCUMENTS

| 5,461,324 A | * | 10/1995 | Boyette | G01R 1/07328 324/73.1 |
| 6,057,695 A | * | 5/2000 | Holt | B25J 9/1694 324/756.05 |
| 2005/0197797 A1 | * | 9/2005 | Dowland | G01R 31/2808 702/115 |

* cited by examiner

*Primary Examiner* — Alvaro E Fortich
(74) *Attorney, Agent, or Firm* — Burris Law, PLLC

(57) ABSTRACT

A horizontal probing fixture includes two bridge modules each having two spaced-apart pedestals, and a bridge plate connecting the pedestals. A first sliding unit for carrying and sliding a probe device includes two first sliding blocks respectively mounted and slidable on the bridge plates of the bridge modules, a first slide plate having two opposite ends respectively connecting the first sliding blocks, and two locking modules respectively disposed on the first sliding blocks. Each first sliding block has a bottom end complementarily engaged to and slidable on the bridge plate of one of the bridge modules. The locking modules are operable to respectively lock or unlock the first sliding blocks relative to the bridge plates.

10 Claims, 18 Drawing Sheets

HORIZONTAL PROBING FIXTURE

FIELD

The disclosure relates to a fixture, and more particularly to a horizontal probing fixture for probing a printed circuit board.

BACKGROUND

FIGS. 1 to 3 illustrate an existing horizontal probing fixture that includes two longitudinal iron plates 11 and a transverse iron plate 12. A probe device 18 is disposed on the transverse iron plate 12 to probe a test workpiece 19, such as a printed circuit board (PCB).

To examine different areas of the test workpiece 19, it is necessary to change the position of the probe device 18 relative to the test workpiece 19 by moving the probe device 18 on the transverse iron plate 12 in a transverse direction (X), as shown in FIG. 2, or moving the transverse iron plate 12 together with the probe device 18 in a longitudinal direction (Y) and along the longitudinal iron plates 11, as shown in FIG. 3. However, after moving the probe device 18 on the transverse iron plate 12, the position of the probe device 18 tends to deviate so that the moving direction of the probe device 18 can be inclined relative to the directions (X) and (Y), rather than being the direction (Y) or (X). It is time-consuming to calibrate the position of the probe device 18 for probing the test workpiece 19. When the transverse iron plate 12 is moved between the longitudinal iron plates 11 in the longitudinal direction (Y), in case two ends of the transverse iron plate 12 are unevenly forced, the transverse iron plate 12 cannot be perpendicular to the longitudinal iron plates 11. It is also time-consuming to calibrate for the position of the probe device 18. Further, because the transverse iron plate 12 is disposed between the longitudinal iron plates 11 in an unsecured manner, if the transverse iron plate 12 is carelessly and overly moved, the transverse iron plate 12 and the probe device 18 will fall down and even may hit the test workpiece 19.

SUMMARY

Therefore, an object of the disclosure is to provide a horizontal probing fixture that can alleviate at least one of the drawbacks of the prior art.

According to the disclosure, a horizontal probing fixture for mounting a probe device includes abase unit and at least one first sliding unit for carrying and sliding the probe device.

The base unit includes two bridge modules spaced apart from each other in a transverse direction. Each of the bridge modules has two pedestals spaced apart from each other in a longitudinal direction perpendicular to the transverse direction, and a bridge plate extending in the longitudinal direction and connecting between the pedestals.

The at least one first sliding unit includes two first sliding blocks respectively and slidably mounted on the bridge plates of the bridge modules, a first slide plate having two opposite ends respectively connecting the first sliding blocks, and two locking modules respectively disposed on the first sliding blocks. Each of the first sliding blocks has a bottom end complementarily engaged to and slidable on a top side of the bridge plate of one of the bridge modules. The locking modules are operable to respectively lock or unlock the first sliding blocks relative to the bridge plates.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
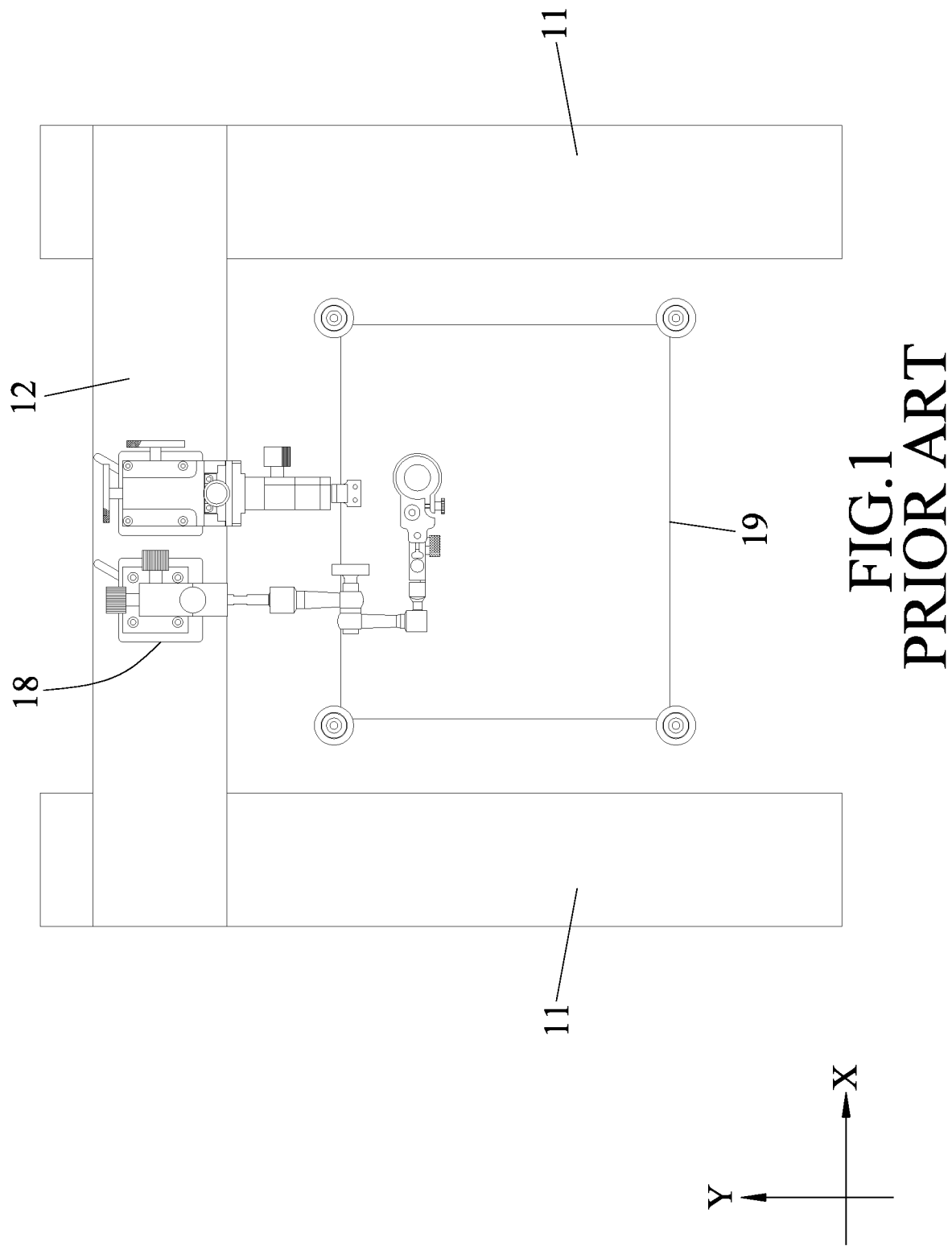
FIG. 1 is a top view of an existing horizontal probing fixture, a probe device, and a test workpiece.
Figure 2:
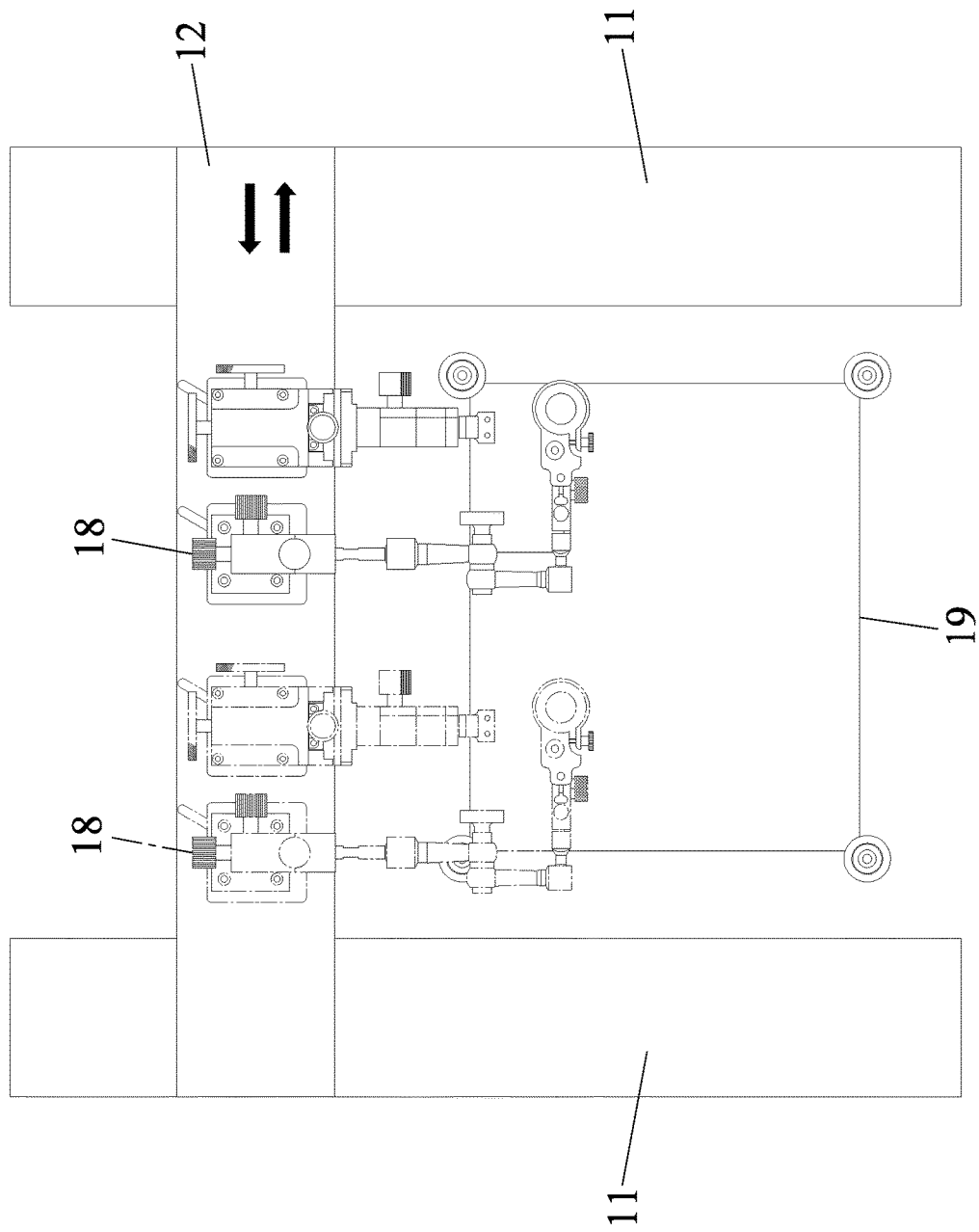
FIGS. 2 and 3 illustrate that the existing horizontal probing fixture and the probe device are operated for probing the test workpiece.
Figure 3:
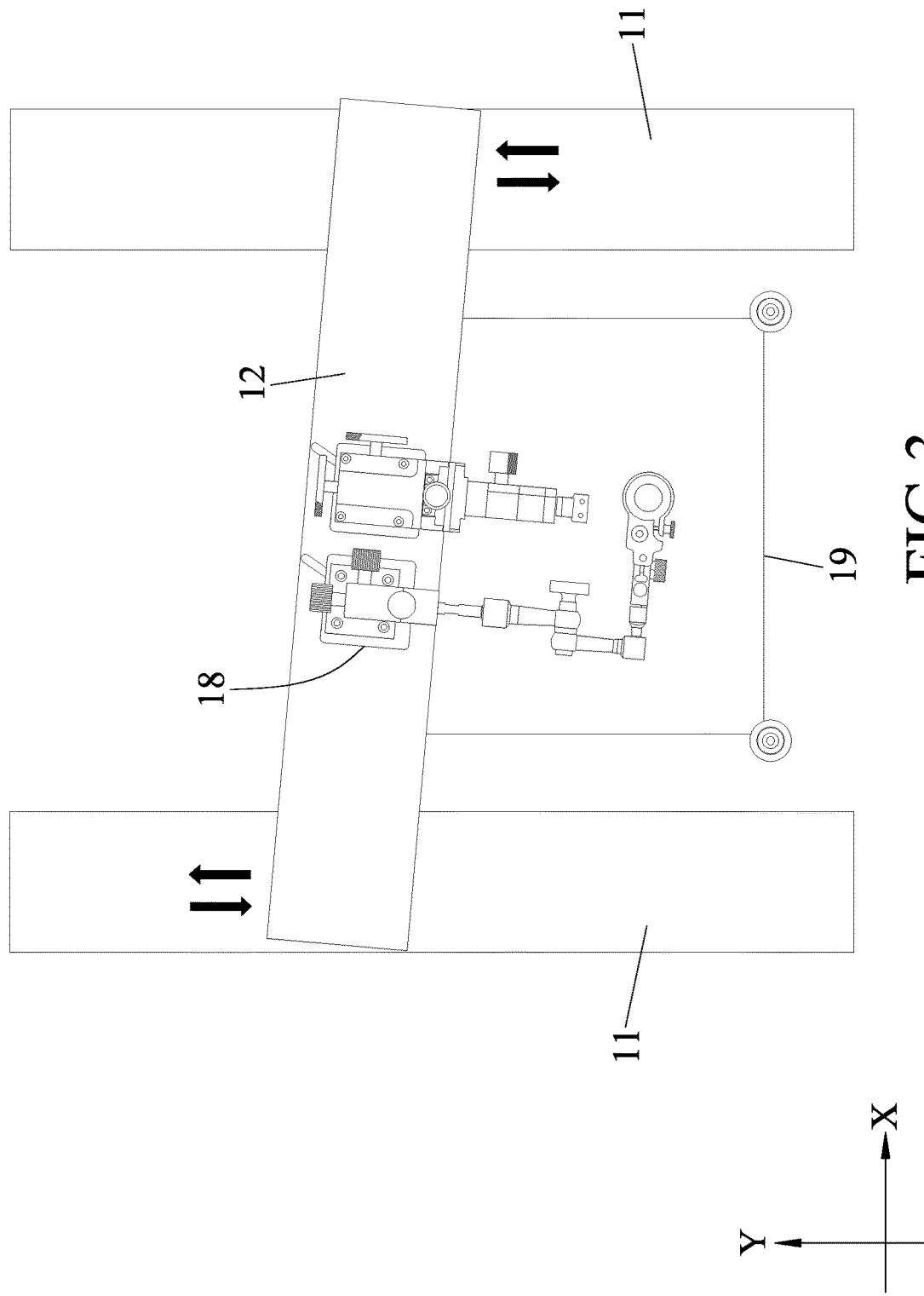

Before the disclosure is described in greater detail, it should be noted that where considered appropriate, reference numerals or terminal portions of reference numerals have been repeated among the figures to indicate corresponding or analogous elements, which may optionally have similar characteristics.

Figure 4:
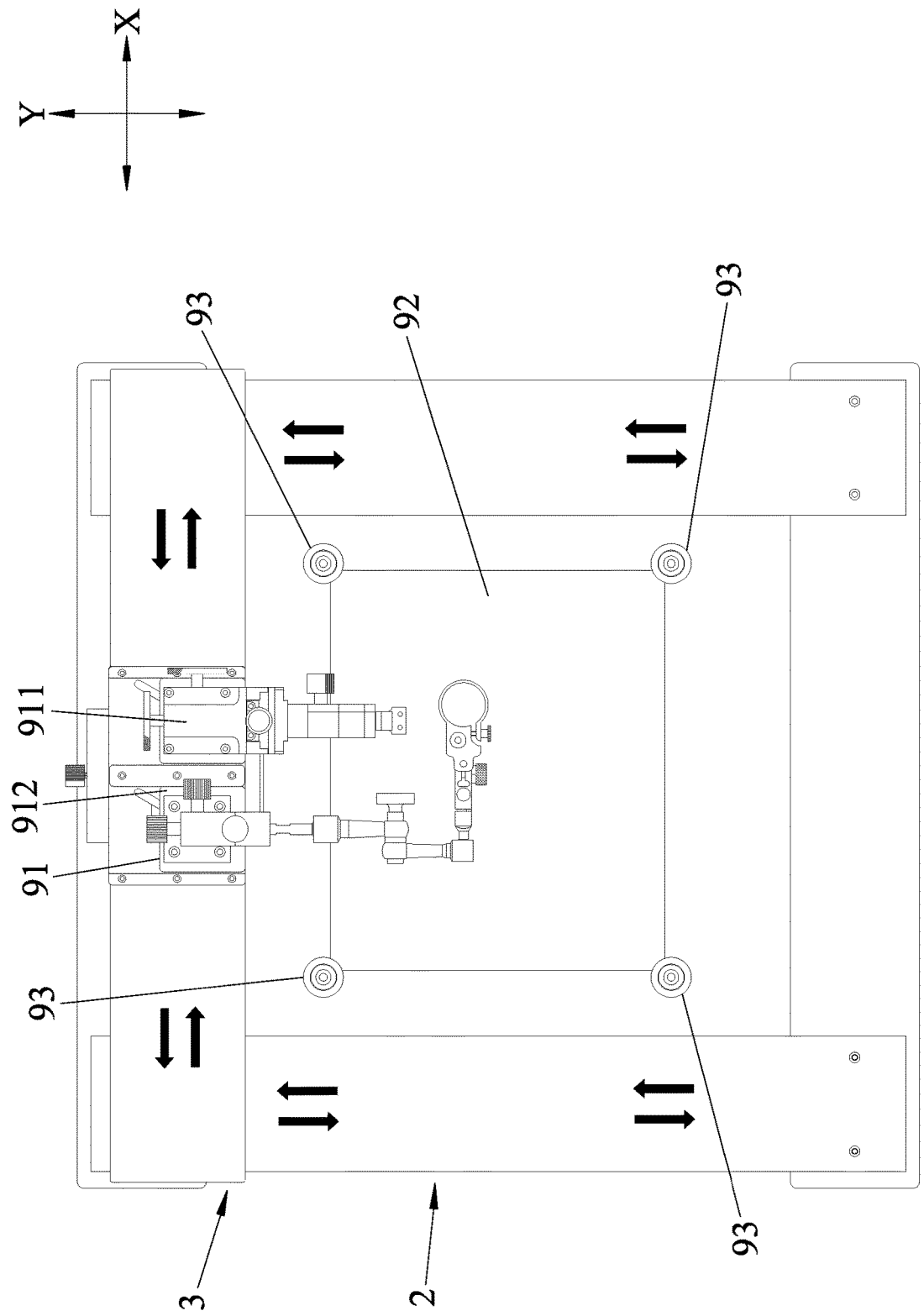
FIG. 4 is a top view illustrating a horizontal probing fixture according to a first embodiment of the disclosure for a probe device and a test workpiece.
Figure 5:
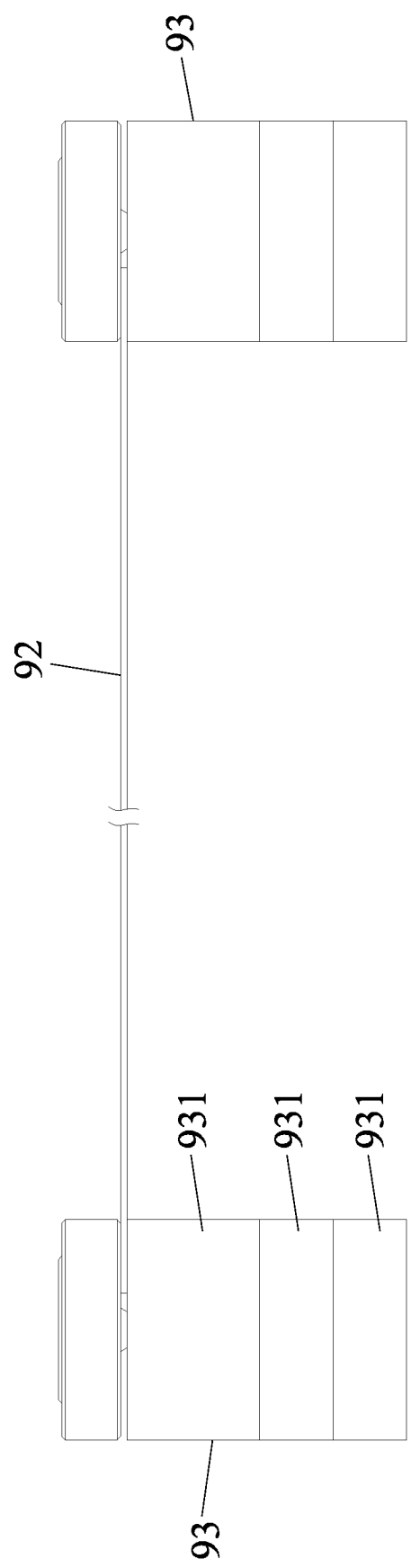
FIG. 5 is a side view illustrating the test workpiece clamped by clamping posts.
Figure 6:
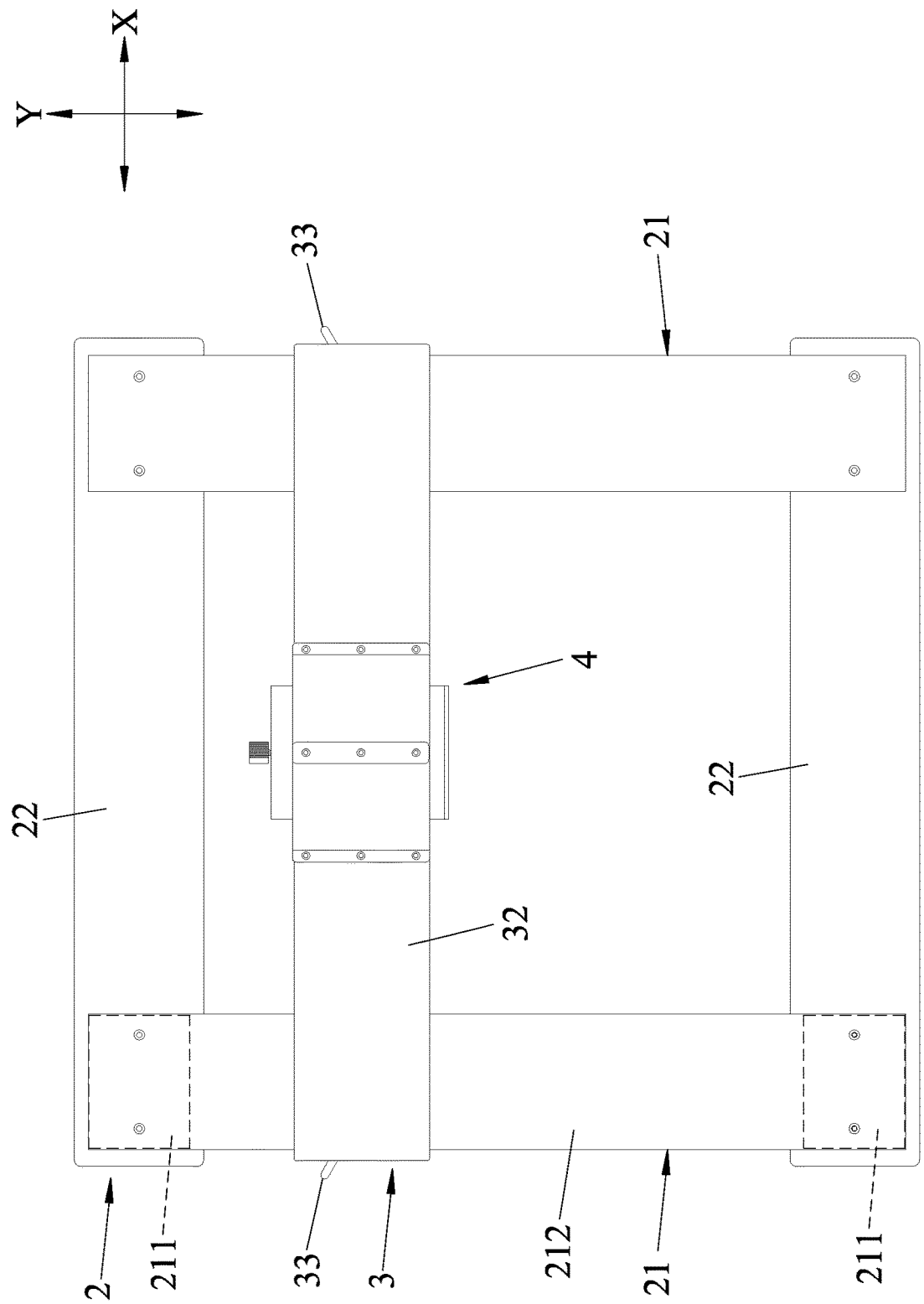
FIG. 6 is a top view of the first embodiment illustrating the horizontal probing fixture with the probe device and the test workpiece being omitted.

Referring to FIGS. 4 to 6, a horizontal probing fixture according to a first embodiment of the disclosure is shown with a probe device 91 being mounted thereon to probe a test workpiece 92. The probe device 91 has a probe seat 911 to clamp probes (not shown), and an electron microscope 912 for image observation. The test workpiece 92 is a printed circuit board (PCB) clamped by four clamping posts 93. Each clamping post 93 is composed of a plurality of magnetic blocks 931 interconnecting with each other. The number of the magnetic blocks 931 can be increased as desired to form a stack with a predetermined height.

In this embodiment, the horizontal probing fixture of the disclosure includes a base unit 2, a first sliding unit 3, and a second sliding unit 4.

Figure 7:
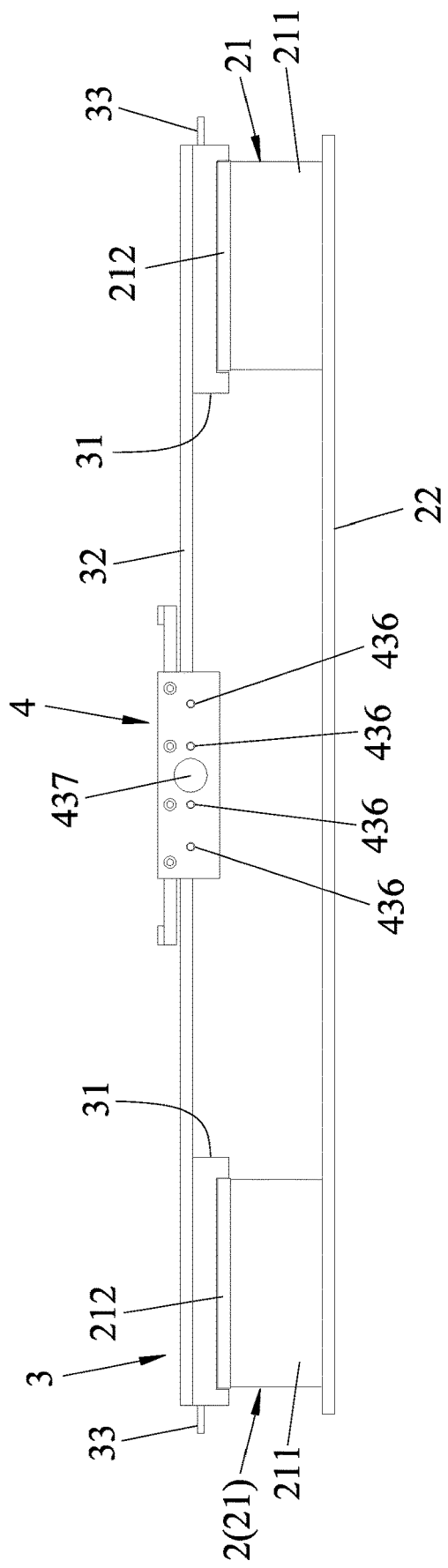
FIG. 7 is a side view of the first embodiment illustrating a base unit, a first sliding unit and a second sliding unit of the horizontal probing fixture.
Figure 8:
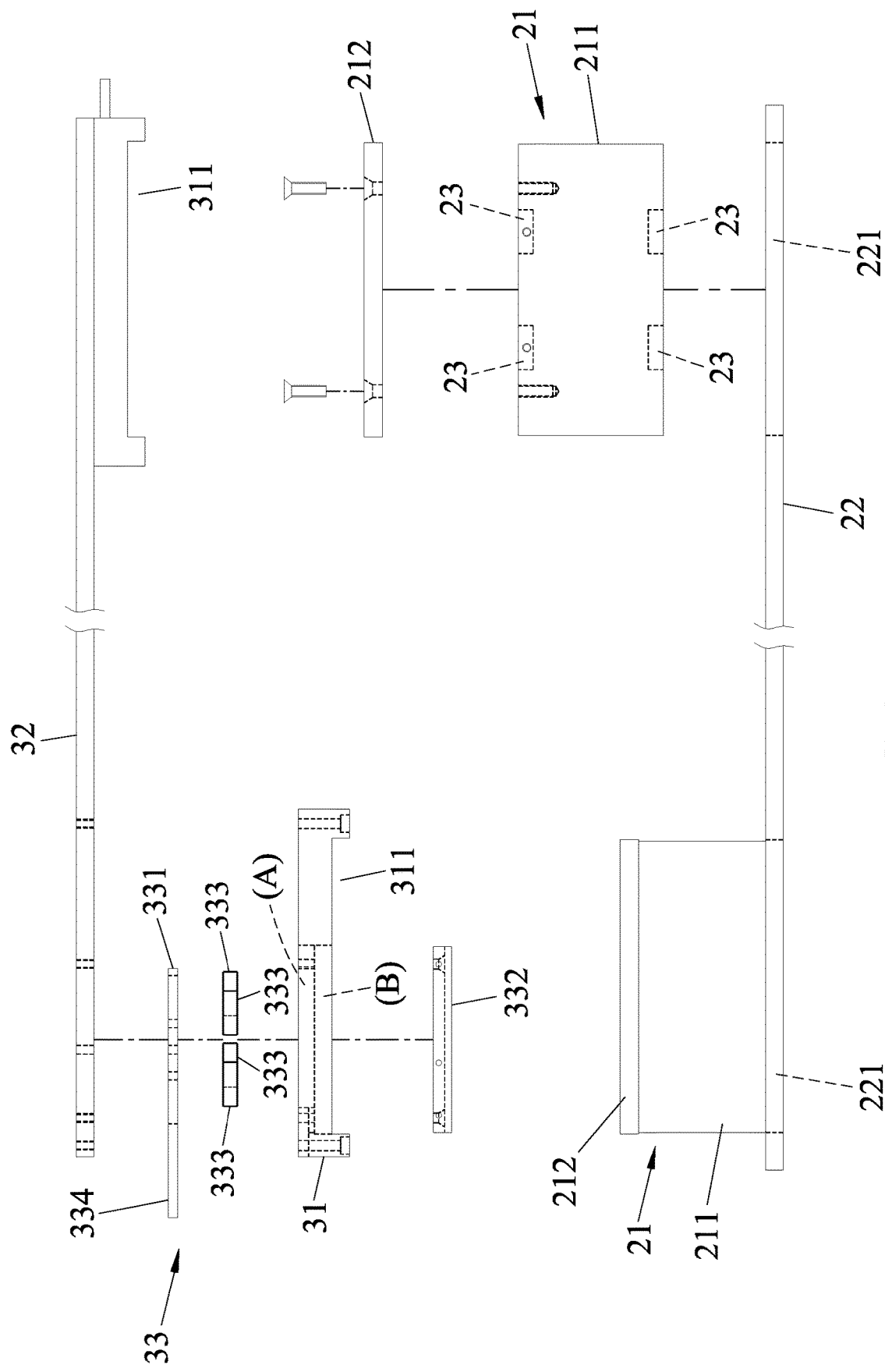
FIG. 8 is a fragmentary exploded side view of the first embodiment.

As shown in FIGS. 6 to 8, the base unit 2 includes two bridge modules 21 spaced apart from each other in a transverse direction (X). Each of the bridge modules 21 has two pedestals 211 spaced apart from each other in a longitudinal direction (Y) perpendicular to the transverse direction (X), and a bridge plate 212 extending in the longitudinal direction (Y) and connected to the pedestals 211 by fastening screws. Each pedestal 211 can be a ferrous or aluminum block. The bridge plate 212 is made of a ferromagnetic material such as iron or SUS 420 stainless steel.

The base unit 2 further includes two pedestal fixing plates 22 extending in the transverse direction (X) and spaced apart from each other in the longitudinal direction (Y). The pedestal fixing plates 22 are spaced lengthwise of the bridge modules 21 on a worktable surface (not shown). Each of the pedestal fixing plates 22 has two opposite ends each of which is formed with a fixing recess 221. The fixing recess 221 is rectangular and complementarily engages one of the pedestals 211 so that the bridge modules 21 are stably fixed. Apart from having a rectangular shape, the fixing recess 221 may also have other suitable polygonal shapes. Further, the fixing recess 221 may be in the form of a blind hole, or a through hole.

Figure 9:
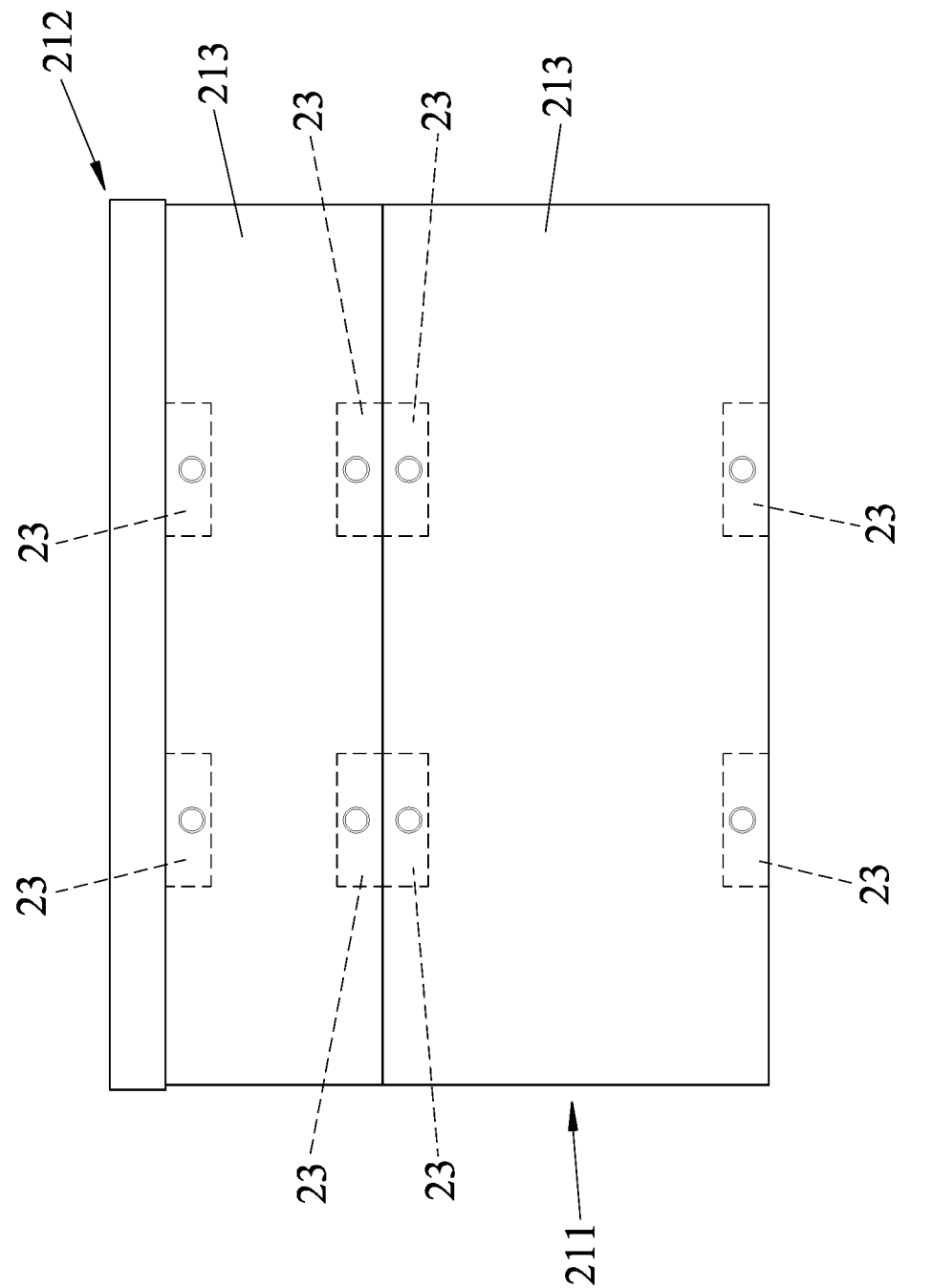
FIG. 9 is a side view illustrating a pedestal connected to a bridge plate by magnets.

The base unit 2 further includes a plurality of magnets 23. The magnets 23 are disposed in top and bottom sides of the pedestals 211. The magnets 23 in the bottom sides of the pedestals 211 can increase stability of the base unit 2 on the worktable surface which is ferromagnetic. Further, if the fixing recess 221 is a blind hole, and if each pedestal fixing plate 22 is made of ferromagnet, the magnets 23 will enhance stability between the pedestals 211 and the pedestal fixing plates 22. As shown in FIG. 9, each pedestal 211 is composed of a plurality of pedestal parts 213. The top and bottom sides of each pedestal part 213 are provided with magnets 23 so that the pedestal parts 231 attract each other and are stacked to form a stabilized structure with a desired height.

Referring back to FIGS. 6 to 8, the first sliding unit 3 for carrying and sliding the probe device 91 (see FIG. 4) is shown as including two first sliding blocks 31, a first slide plate 32, and two locking modules 33.

The two first sliding blocks 31 are respectively mounted and slidable on the bridge plates 212 of the bridge modules 21. Each of the first sliding blocks 31 has a bottom end complementarily engaged to and slidable on a top side of the bridge plate 212 of one of the bridge modules 21. In particular, each of the first sliding blocks 31 has a recess 311 extending in the longitudinal direction (Y) and slidable relative to the bridge plate 212 of the respective bridge module 21. In this embodiment, the top side of the bridge plate 212 is quadrilateral. The bottom end of each first sliding block 31 is inverted U-shaped. However, the bottom end may also have any other suitable shape, such as C-shape, or gourd-shape, which enables the first sliding block 31 to complementarily engage and stably slide on the top side of the bridge plate 212. Each first sliding block 31 is made of Polyoxymethylene (POM) that reduces friction and is non-ferromagnetic.

The first slide plate 32 has two opposite ends respectively connecting the first sliding blocks 31. In this embodiment, the first slide plate 32 is made of a ferromagnetic material such as iron or SUS 420 stainless steel.

As shown in FIGS. 8, 10 to 12, the two locking modules 33 are respectively disposed on the first sliding blocks 31. Each locking module 33 has a magnet rotating disc 331 made of a non-magnetic material disposed in a groove (A) of the respective first sliding block 31, a bottom plate 332 disposed in a groove (B) of the respective first sliding block 31 below the magnet rotating disc 331, and four magnets 333 inserted into the magnet rotating disc 331. The magnet rotating disc 331 is provided with a lever 334. The bottom plate 332 is composed of two magnetizable plates 335 (e.g., iron) spaced by a non-magnetizable plate 336 (e.g., aluminum). The magnets 333 are arranged in two pairs. Each pair of the magnets 333 has N and S magnetic poles at either one of upper and lower sides of the magnet rotating disc 331.

Figure 10:
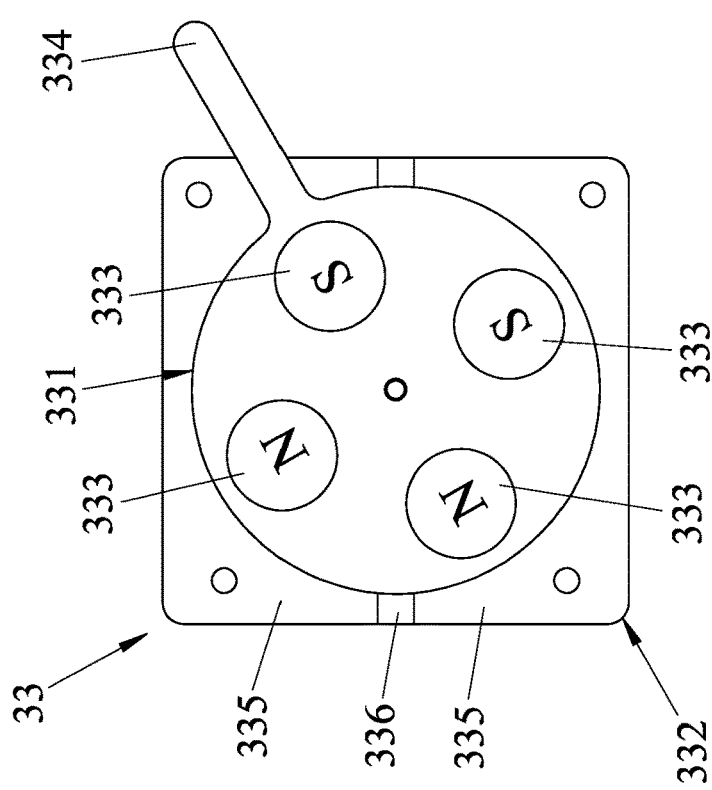
Figure 12:
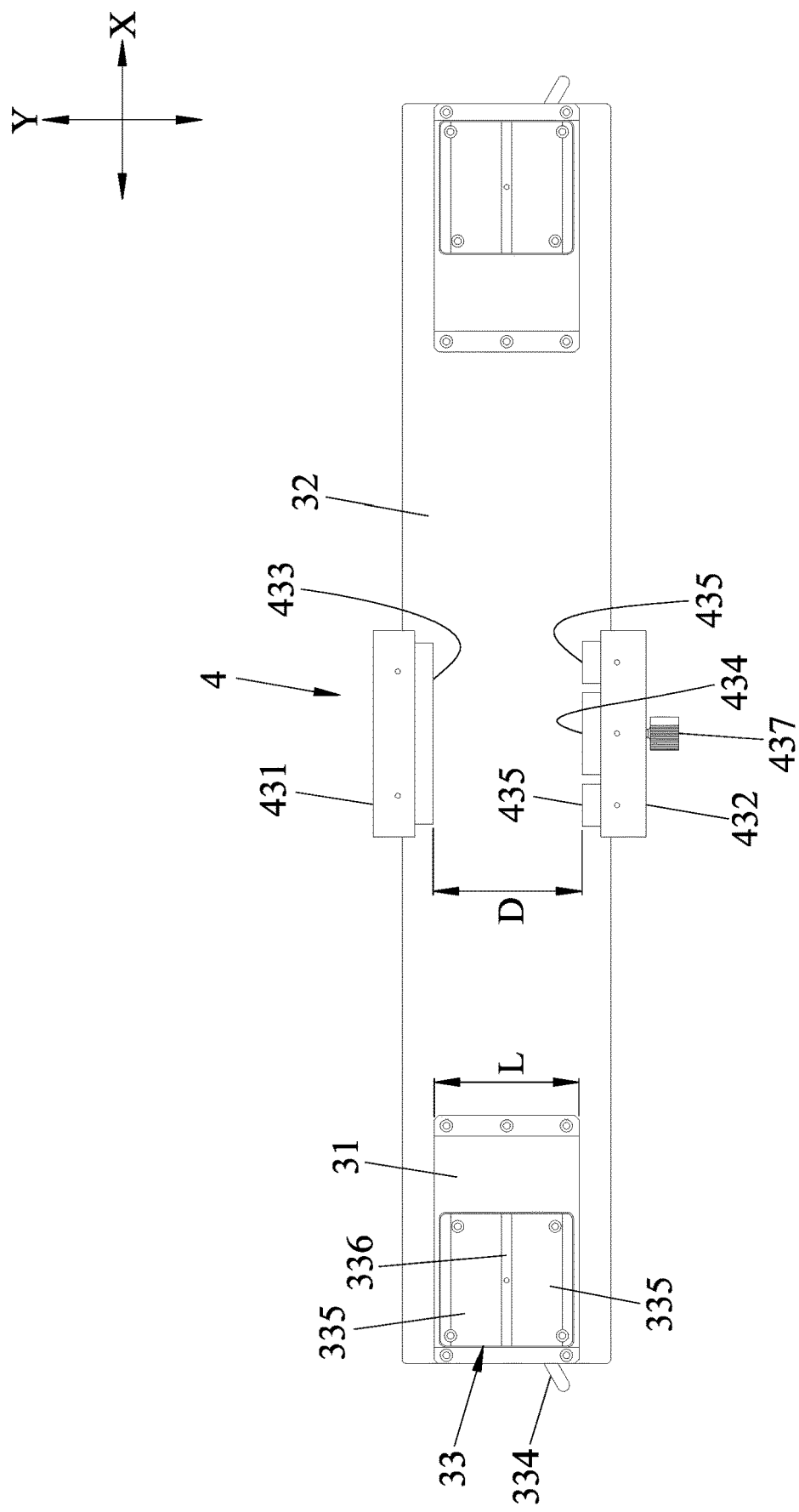
FIG. 12 is a bottom view illustrating the locking modules, first sliding blocks and the second sliding unit on a bridge plate.

When the lever 334 is operated to rotate the magnet rotating disc 331 as shown in FIG. 10, each magnetizable plate 335 has thereon N and S magnetic poles so that magnetic flux flows inside the magnetizable plate 335. Therefore, the attraction forces of the magnets 333 to attract the respective bridge plate 212 are reduced. That is to say, the external magnetic fields of the magnets 333 of the locking modules 33 are turned off to unlock the respective sliding blocks 31 relative to the respective bridge plates 212. In this situation, the first slide plate 32 is allowed to move in the longitudinal direction (Y).

Figure 11:
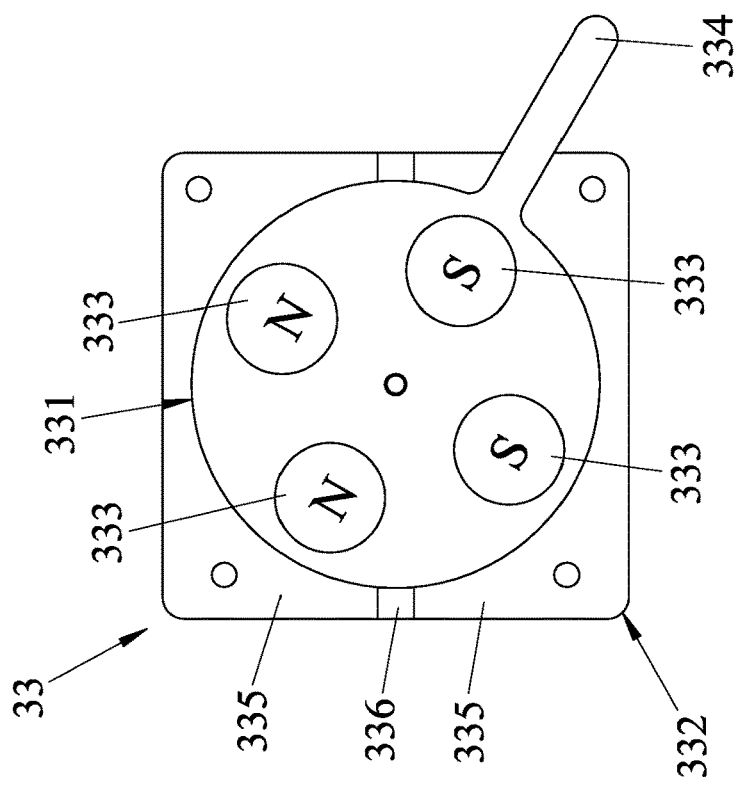
FIGS. 10 and 11 are top views illustrating a locking module in OFF and ON states.

When the rotary disc 331 is rotated by the lever 334 as shown in FIG. 11, there are only N or S magnetic poles on each magnetizable plate 335. Further, due to the non-magnetizable plate 336 disposed between the magnetizable plates 335, there is no magnetic flux between the magnetizable plates 335. Therefore, the magnets 333 have external magnetic flux to attract the respective bridge plate 212. In other words, the external magnetic fields of the locking modules 33 are turned on to lock the respective sliding blocks 31 relative to the respective bridge plates 212. In this situation, the first sliding blocks 31 are immobilized on the bridge plates 212.

Noteworthily, the first slide plate 32 is ferromagnetic so that upper magnetic induction lines of the magnets 333 flow inside the first slide plate 32. That is to say, the upper magnetic induction lines are shielded by the first slide plate 32 and do not affect or attract the probe device 91 disposed on the first slide plate 32.

While the locking modules 33 are magnetic lockers in this embodiment, each locking module 33 may be in other forms such as those using screw fasteners, or rotary knobs.

Referring to FIGS. 12 to 15, the second sliding unit 4 is disposed on the first slide plate 32 and is slidable in the transverse direction (X) relative to the first slide plate 32. The sliding unit 4 has a mounting plate 41, an alignment unit 42, and a second sliding block module 43.

The mounting plate 41 is disposed over the first slide plate 32 for mounting the probe device 91 (see FIG. 4). In this embodiment, the mounting plate 41 is made of a ferromagnetic material, such as iron, to fixedly position a magnetic/ferromagnetic seat of the probe device 91.

The alignment unit 42 is disposed on the mounting plate 41 for alignment of the probe device 91. The alignment unit 42 includes a plurality of alignment plates 421 parallel spaced apart from each other. The alignment plates 421 may extend in the longitudinal direction (Y), or may be shaped to be complementary to a bottom shape of the probe device 91 for guiding and aligning the probe device 91 with respect to the test workpiece 92.

The second sliding block module 43 is coupled to the mounting plate 41, complementarily engaged to the first slide plate 32 and slidable relative to the first slide plate 32 in the transverse direction (X). The second sliding block module 43 has front and rear support blocks 431, 432, a front sliding block 433, a rear sliding block 434, two auxiliary sliding blocks 435, a plurality of adjusters 436, a fixing member 437, and three shim plates 438.

Figure 13:
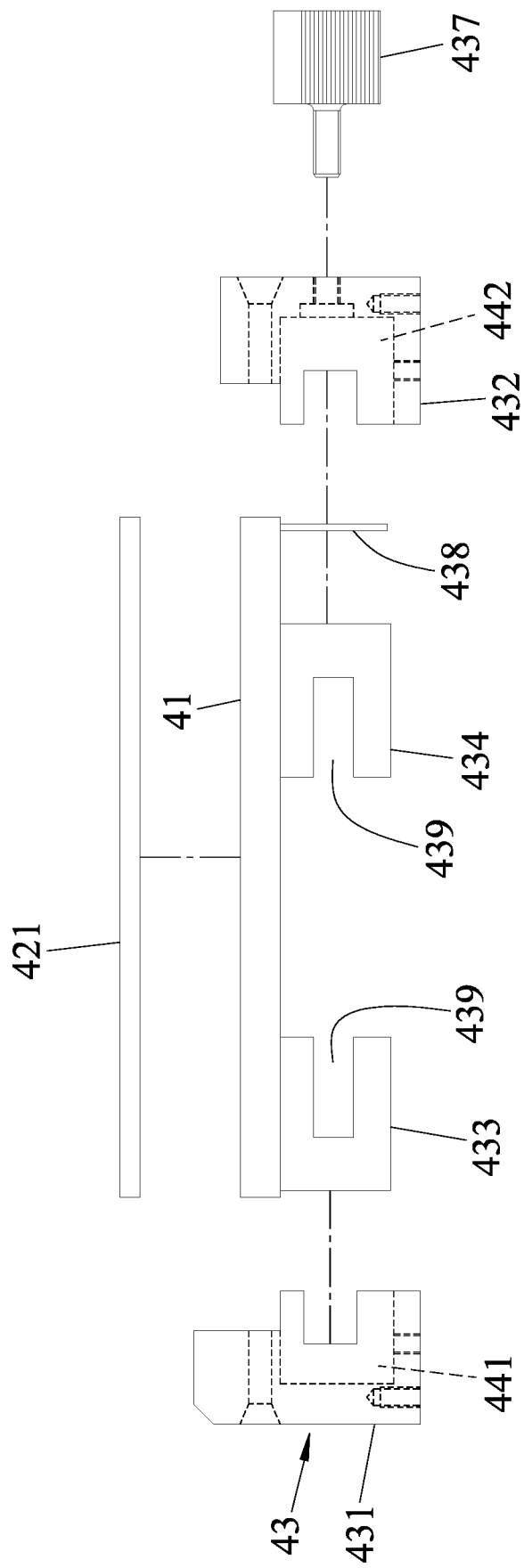
FIG. 13 is an exploded side view illustrating the second sliding unit.
Figure 14:
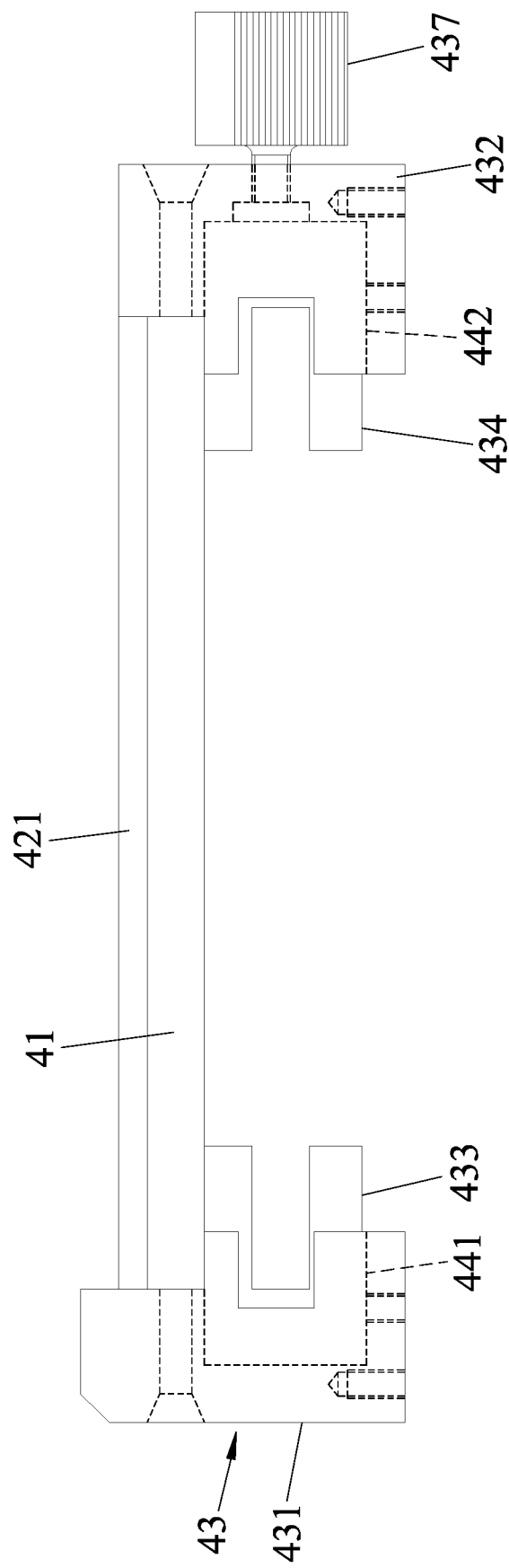
FIG. 14 is a side view illustrating the second sliding unit in an assembled state.
Figure 15:
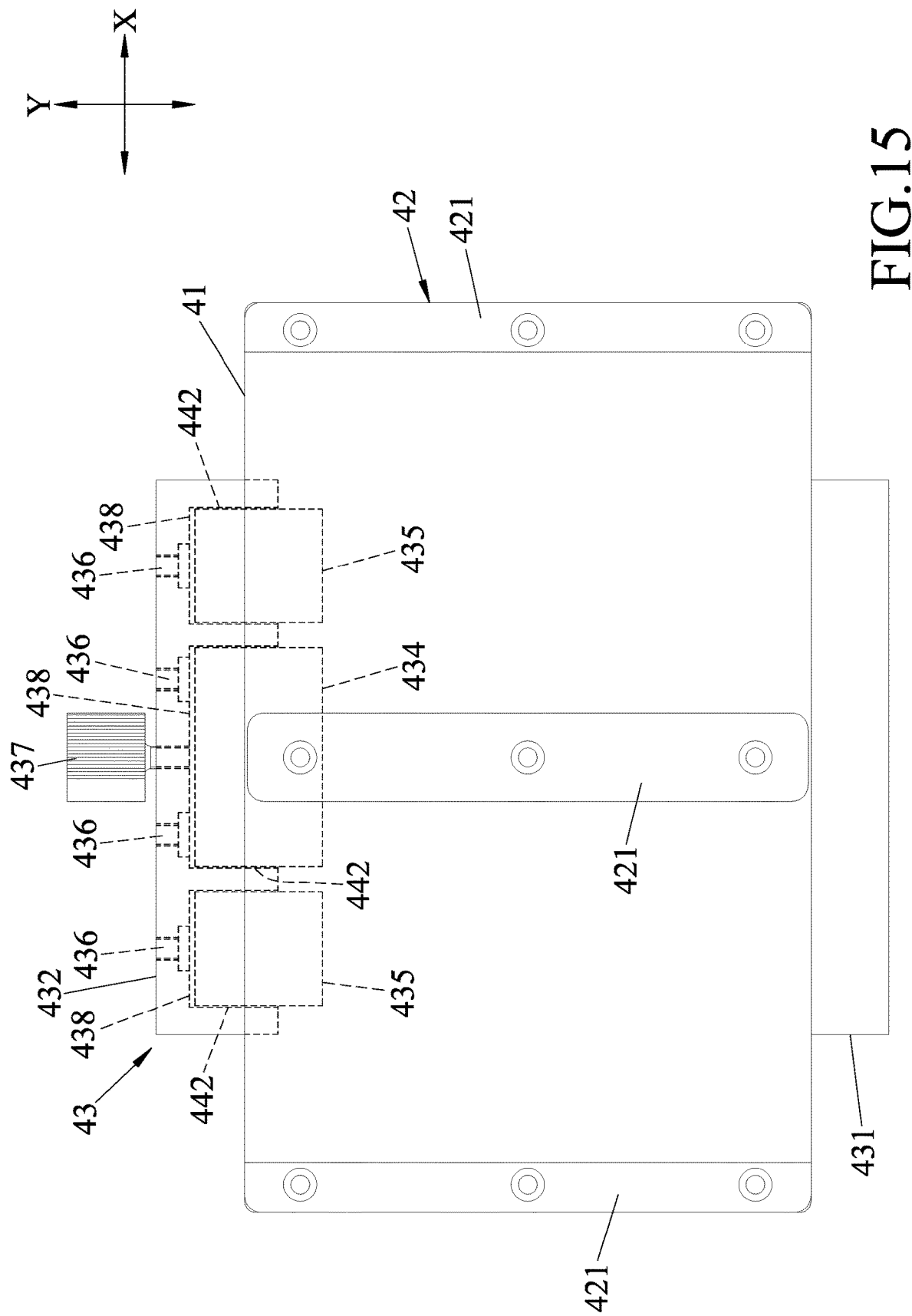
FIG. 15 is a bottom view illustrating the second sliding unit.

In this embodiment, the mounting plate 41 has front and rear sides opposite to each other in the longitudinal direction (Y). The front and rear support blocks 431, 432 are respectively screwed to the front and rear sides of the mounting plate 41. The front support block 431 has a front recess 441. The rear support block 432 has three rear recesses 442 facing the front recess 441 (FIGS. 13, 15).

The front sliding block 433 is inserted in the front recess 441 and is secured to the front support block 431 by a screw (not shown) inserted upwardly from a bottom side of the front support block 431.

The rear sliding block 434 is inserted in a middle one of the rear recesses 442. A screw (not shown) is inserted from a bottom side of the rear support block 432 to abut and prevent the rear sliding block 434 from displacing downwardly.

The two auxiliary sliding blocks 435 are respectively disposed on two sides of the rear sliding block 434 that are opposite in the transverse direction (X). In particular, the auxiliary sliding blocks 435 are respectively inserted in the other two rear recesses 442. Screws (not shown) are inserted from the bottom side of the rear support block 432 to abut and prevent the auxiliary sliding blocks 435 from displacing downwardly.

The front sliding block 433, the rear sliding block 434 and the auxiliary sliding blocks 435 respectively define slide recesses 439 slidably engaging the first slide plate 32.

In this embodiment, a distance (D) between the front sliding block 433 and the first rear sliding block 434 in the longitudinal direction (Y) below the first slide plate 32 is greater than a length (L) of each of the first sliding blocks 31 in the longitudinal direction (Y) below the first slide plate 32. In addition, a distance (D) between the front sliding block 433 and each auxiliary sliding block 435 in the longitudinal direction (Y) below the first slide plate 32 is greater than the length (L) of each of the first sliding blocks 31 in the longitudinal direction (Y) below the first slide plate 32. Therefore, the second sliding unit 4 can be unimpededly moved on the first slide plate 32. Particularly, in this embodiment, the front sliding block 433, the rear sliding block 434 and the auxiliary sliding blocks 435 are U-shaped, and the recesses 439 of the rear block 434 and the auxiliary sliding blocks 435 open toward the recess 439 of the front sliding block 433. Because the length (L) is smaller than the distance (D), the first sliding blocks 31 are not located on the sliding paths of the front sliding block 433, the rear sliding block 434 and the auxiliary sliding blocks 435. Therefore, the second sliding unit 4 is allowed to slide from the rightmost end to the leftmost end of the first slide plate 32. Due to the U-shaped configurations of the front sliding block 433, the rear sliding block 434 and the auxiliary sliding blocks 435, the second sliding unit 4 can be stably retained on the first slide plate 32. Even if the the first slide plate 32 is turned upside down by 180 degrees, the second sliding unit 4 can be prevented from falling off the first slide plate 32.

Each of the front sliding block 433, the rear sliding block 434 and the auxiliary sliding blocks 435 may be made of polyoxymethylene (POM) or other low friction materials, such as telflon. While the front sliding block 433, the rear sliding block 434 and the auxiliary sliding blocks 435 are U-shaped in this embodiment, they may have other suitable shapes that can allow the second sliding unit 4 to stably slide on the first slide plate 32.

The adjusters 436 extend through the rear support block 432. The adjusters 436 are operable to move the rear and auxiliary sliding blocks 434, 435 toward the first slide plate 32. In this embodiment, each adjuster 436 is a screw. By rotating the adjusters 436, the distances of the rear and auxiliary sliding blocks 434, 435 from the first slide plate 32 can be adjusted. When the distances are large, the second sliding unit 4 is in a loosened state and can slide easily on the first slide plate 32 but will sway during sliding. When the distances are small, the second sliding unit 4 is less loosened. Swaying is reduced, but sliding of the second sliding unit 4 will become unsmooth. Based on actual needs, an operator may operate the adjusters 436 to adjust the level of looseness or tightness of the rear and auxiliary sliding blocks 434, 435 with respect to the first slide plate 32.

The fixing member 437 is mounted to the rear support block 432 and is operable to fix or unfix the mounting plate 41 relative to the first slide plate 32. The fixing member 437 extends through the rear support block 432 and is operable to move the rear sliding block 434 toward the first slide plate 32. In this embodiment, the fixing member 437 is a threaded rotary knob. After the second sliding unit 4 slides to a predetermined position, the fixing member 437 may be rotated so that the rear sliding block 434 abuts the first slide plate 32 and the second sliding unit 4 is immobilized on the first slide plate 32. To move the second sliding unit 4, the fixing member 437 may be loosened by rotation.

The shim plates 438 are disposed between the rear support block 432 and the rear sliding block 434, and between the rear support block 432 and the auxiliary sliding blocks 435. The shim plates 438 are respectively pressed by the adjusters 436 against the rear and auxiliary sliding blocks 434, 435 to move the rear and auxiliary sliding blocks 434, 435. The shim plates 438 are made from metal to avoid direct contact of the rear and auxiliary sliding blocks 434, 435 with the adjusters 436. Therefore, the auxiliary sliding blocks 435 (made of POM) and the rear sliding block 434 are prevented from being damaged by the adjusters 436.

Referring back to FIGS. 4, 6 and 7, to place the probe device 91 in a proper position for probing the test workpiece 92, the first slide plate 32 may be slid in the longitudinal direction (Y), and the second sliding unit 4 may be slid in the transverse direction (X). Because the pedestals 211 of the bridge modules 21 are disposed at equal distances and at the same height, the first slide plate 32 can be stably and perpendicularly connected between the bridge plates 212. The first slide plate 32 with the second sliding unit 4 can slide in the longitudinal direction (Y) between the bridge plates 212 without deviating from longitudinal and transverse axes of the horizontal probing fixture of the disclosure. As such, it is unnecessary to frequently calibrate the probe device 91. Time for probing the test workpiece 92 can be greatly saved. Further, when the first slide plate 32 is moved to a selected position, the locking modules 33 may be operated to respectively lock the first sliding blocks 31 and fix the first slide plate 32 relative to the bridge plates 212. When the second slide unit 4 reaches a selected position, the fixing member 437 may be rotated to fix the second slide unit 4 to the first slide plate 32. Whether the horizontal probing fixture is in an unlocked moving state or a locked state, the first and second sliding units 3 and 4 are stable and can be prevented from falling down and hitting the test workpiece 92.

To sum up, the advantages of the disclosure are the following:

1. Because the bottom ends of the first sliding blocks 31 complementarily and slidably engage the top sides of the bridge plates 212, the first slide plate 32 can be prevented from falling off the bridge plates 212. Safe operation can therefore be ensured.

2. By virtue of the pedestal plates 22 to preset the positions of the pedestals 211 of the bridge modules 21, the pedestals 211 can be easily placed in a rectangular array during installation thereof. Time for correcting the position of the base unit 2 can be saved, and installation of the base unit 2 is convenient.

3. By rotating the adjusters 436, sliding stability and smoothness of the second sliding unit 4 on the first slide plate 32 can be adjusted. Further, the second slide unit 4 can be immobilized at a selected position by rotating the fixing member 437.

Figure 16:
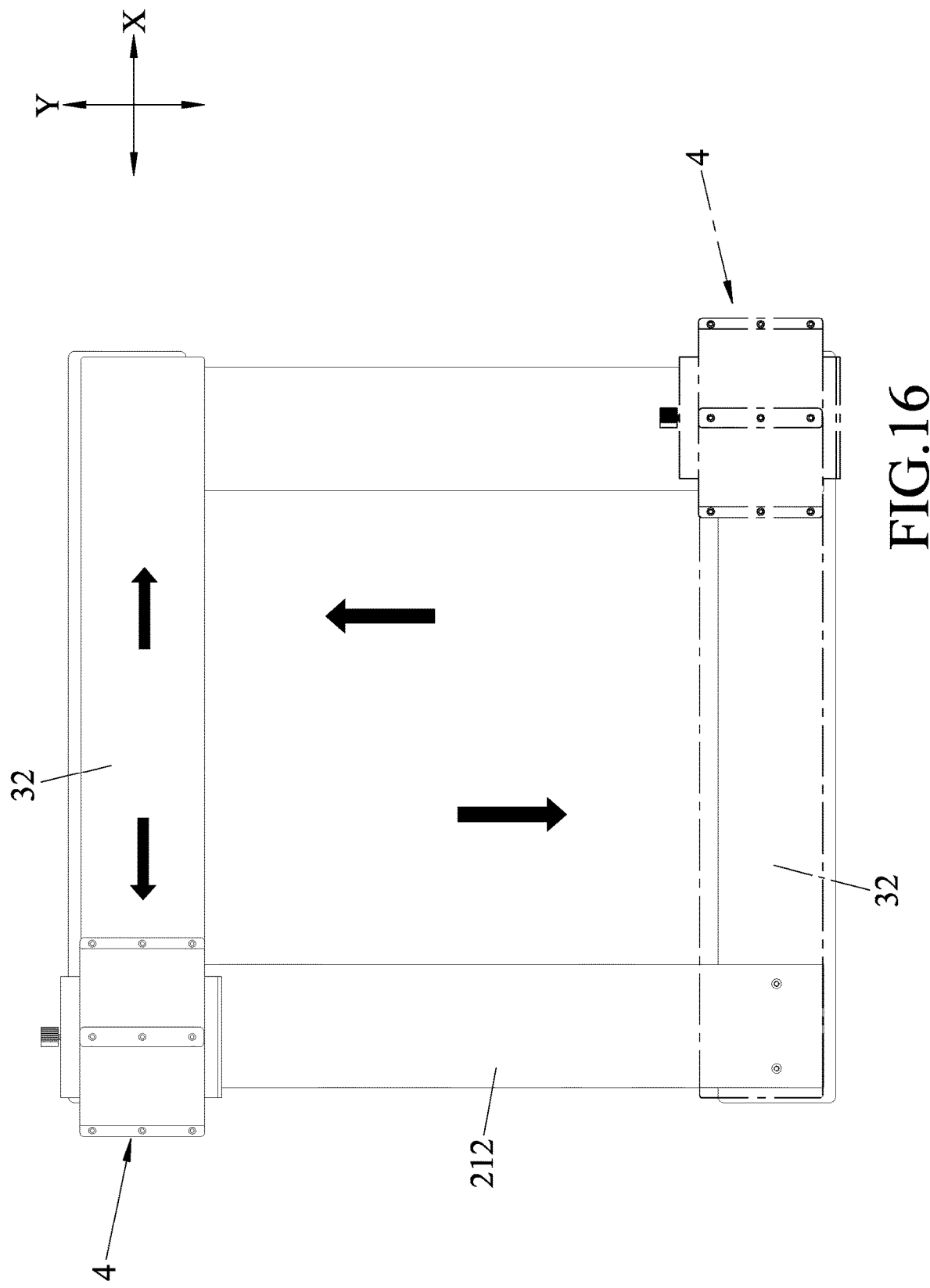
FIG. 16 is a top view illustrating how the second sliding unit travels in the horizontal probing fixture.

4. As shown in FIG. 16, the first slide plate 32 connecting the first sliding blocks 31 can move from the topmost ends (see solid lines) to the bottommost ends (see phantom lines) of bridge plates 212. Because the distance (D) (FIG. 12) of each of the rear and auxiliary sliding blocks 434, 435 from the front sliding block 433 is greater than the length (L) (FIG. 12) of each first sliding block 31, the second sliding unit 4 can move from the rightmost position (see solid lines) to the leftmost position (see phantom lines) without being interfered by the first sliding blocks 31. Accordingly, the horizontal probing fixture of the disclosure is able to probe a wide range of area on the test workpiece 92.

Figure 17:
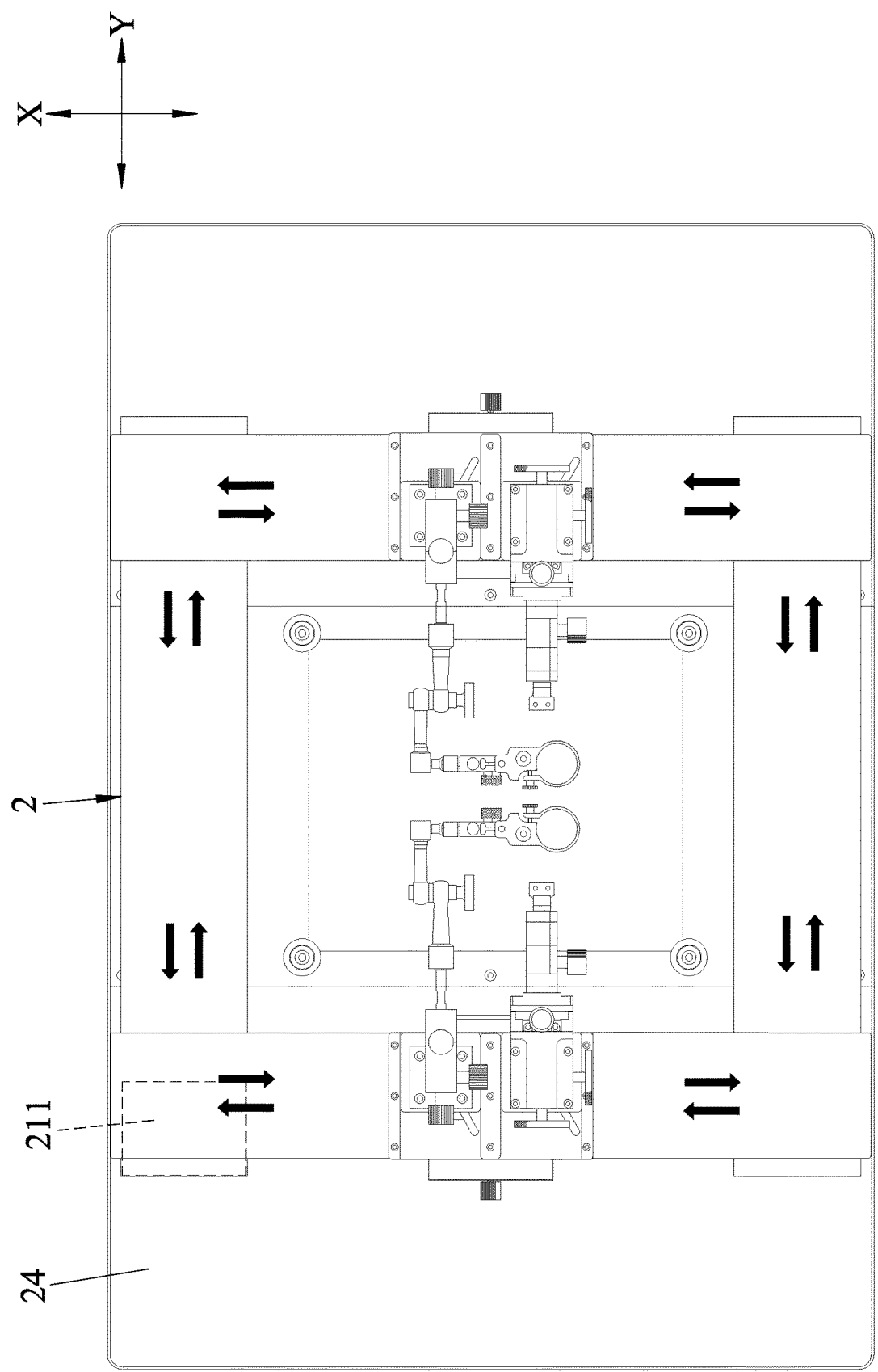
FIG. 17 is a top view of a horizontal probing fixture according to a second embodiment of the disclosure.
Figure 18:
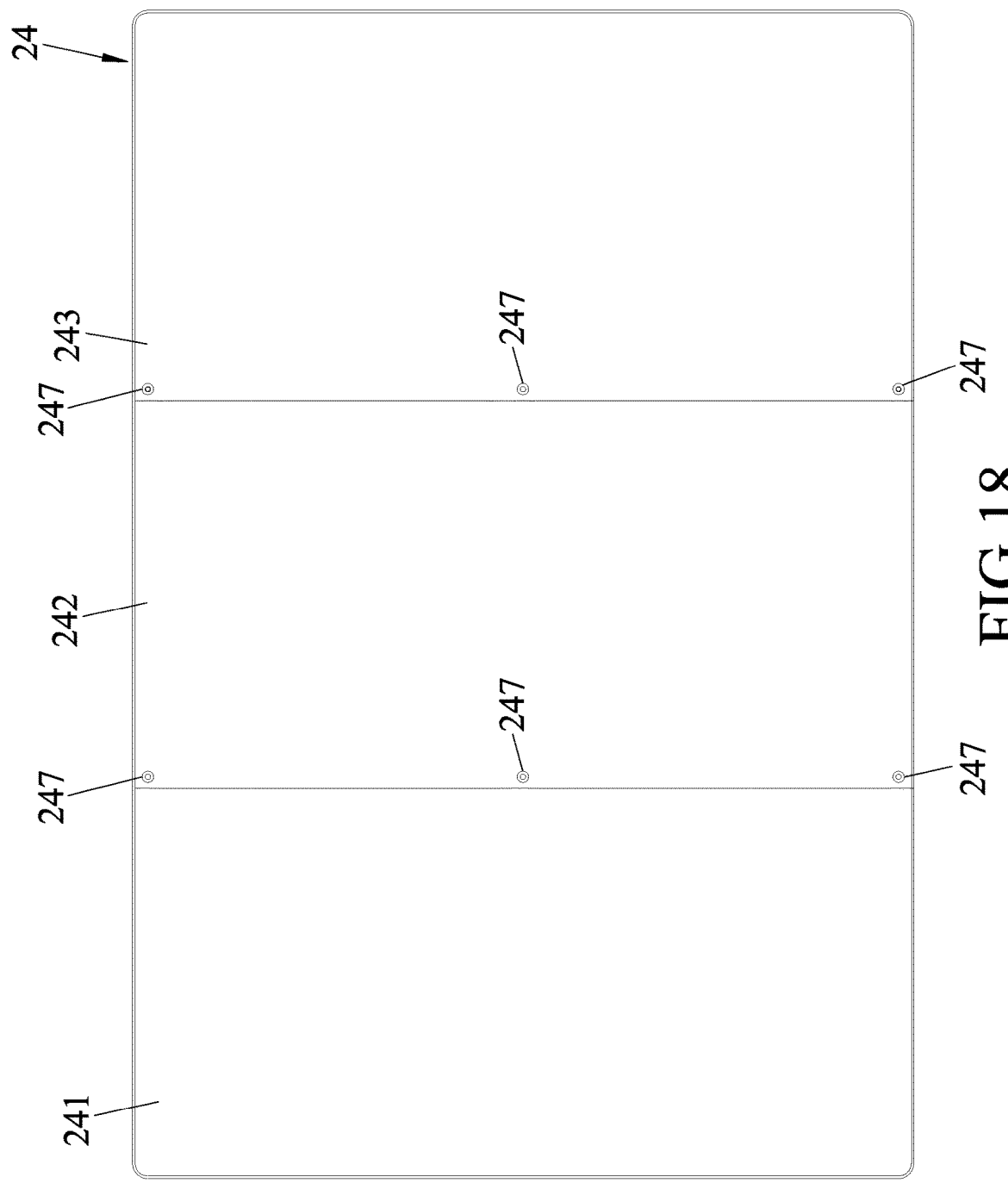
FIG. 18 is a top view of the second embodiment illustrating a worktable module of the horizontal probing fixture in an assembled state.
Figure 19:
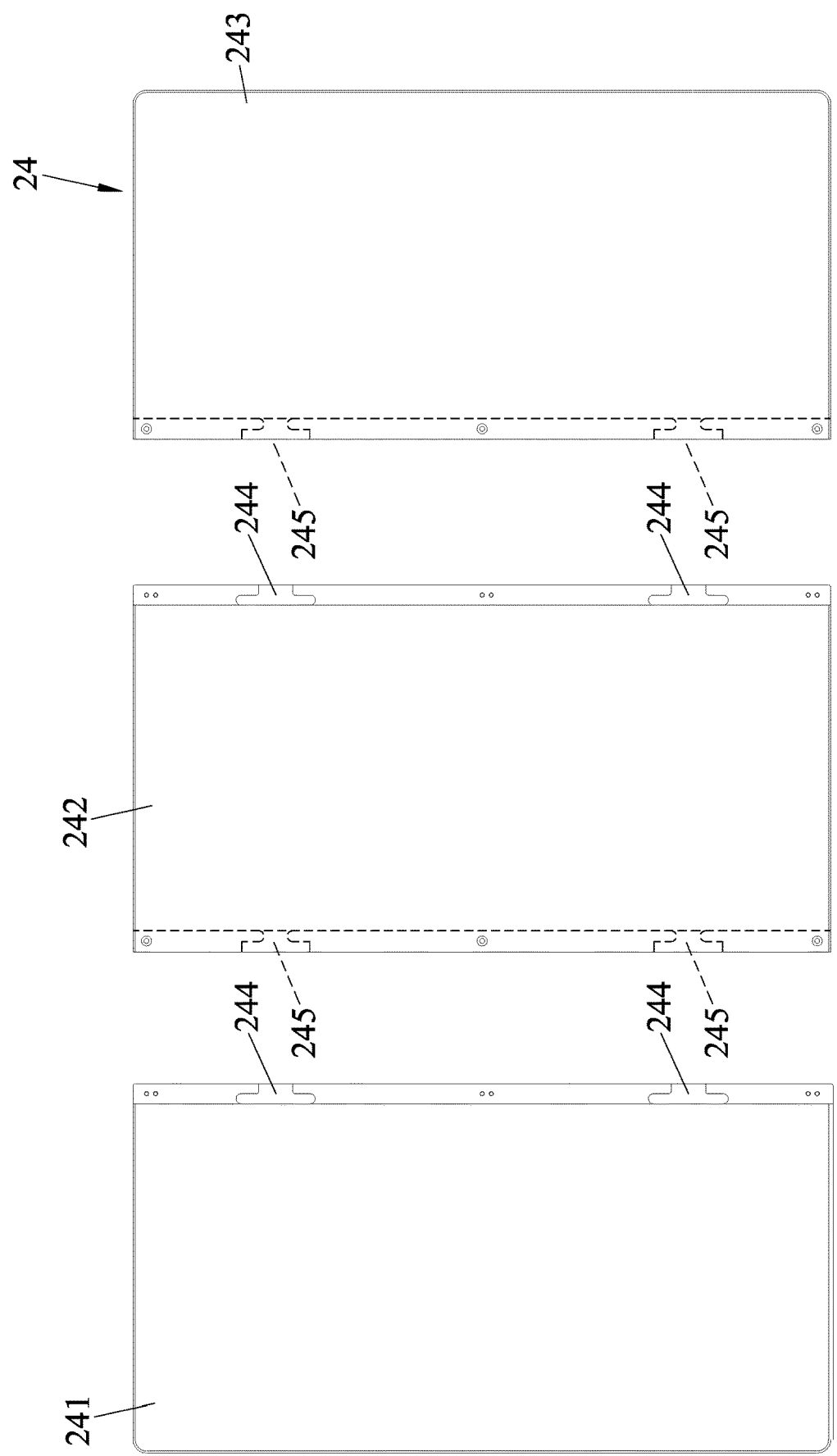
FIG. 19 is a top view similar to FIG. 18 but illustrating the worktable module in a disassembled state.

FIGS. 17 to 19 illustrate a horizontal probing fixture of a second embodiment according to the disclosure, which has a structure similar to that of the first embodiment. However, the base unit 2 further includes a worktable module 24 for placement of the bridge modules 21 and the pedestal plates 22.

When there is no appropriate support surface for placement of the bridge modules 21 and the pedestal plates 22, the worktable module 24 may be used as a worktable surface. The worktable module 24 can be made of SUS 420 stainless steel which is durable and is magnetizable by the magnets 23 in the bottom sides of the pedestals 211. Therefore, the connective stability between the pedestals 211 and the worktable module 24 is enhanced.

The worktable module 24 has a first panel 241, a second panel 243, and an intermediate panel 242 disposed between the first and second panels 241, 243. The intermediate panel 242 is optional. The number of the intermediate panel 242 may be varied, or, the intermediate panel 242 may be omitted in other embodiments. When the worktable module 24 is required to be lengthened, the number of the intermediate panels 242 may be increased.

The first panel 241, the intermediate 242, and the second panel 243 are releasably interlocked with each other. In this embodiment, the right side of each of the first and intermediate panels 241, 242 is formed with two spaced-apart grooves 244. The left side of the intermediate and second panels 242, 243 is formed with two spaced-apart protrusions 245. The protrusions 245 are complementarily interlocked with respective grooves 244. Further, a plurality of screws 247 are provided for assembling and enhancing stability of the worktable module 24.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A horizontal probing fixture for mounting a probe device, comprising:
    a base unit including two bridge modules spaced apart from each other in a transverse direction, each of said bridge modules having two pedestals spaced apart from each other in a longitudinal direction perpendicular to the transverse direction, and a bridge plate extending in the longitudinal direction and connecting between said pedestals; and
    at least one first sliding unit for carrying and sliding the probe device, said at least one first sliding unit including two first sliding blocks respectively and slidably mounted on said bridge plates of said bridge modules, a first slide plate having two opposite ends respectively connecting said first sliding blocks, and two locking modules respectively disposed on said first sliding blocks, each of said first sliding blocks having a bottom end complementarily engaged to and slidable on a top side of said bridge plate of one of said bridge modules, said locking modules being operable to respectively lock or unlock said first sliding blocks relative to said bridge plates.

2. The horizontal probing fixture as claimed in claim 1, wherein each of said first sliding blocks has a recess extending in the longitudinal direction and slidably engaging the respective one of said bridge plates.

3. The horizontal probing fixture as claimed in claim 1, wherein said base unit further includes two pedestal fixing plates extending in the transverse direction and spaced apart from each other in the longitudinal direction, each of said pedestal fixing plates having two opposite ends each of which is formed with a fixing recess, said fixing recess being polygonal and complementarily engaging one of said pedestals.

4. The horizontal probing fixture as claimed in claim 1, further comprising at least one second sliding unit disposed on said first slide plate and slidable in the transverse direction relative to said first slide plate, said at least one second sliding unit having a mounting plate disposed over said first slide plate for mounting the probe device, and a second sliding block module coupled to said mounting plate, said second sliding block module being complementarily engaged to said first slide plate, and being slidable relative to said first slide plate in the transverse direction.

5. The horizontal probing fixture as claimed in claim 4, wherein:
    said mounting plate has front and rear sides opposite to each other in the longitudinal direction;
    said second sliding block module has front and rear support blocks respectively coupled to said front and rear sides of said mounting plate,
a front sliding block inserted in said front support block,
a rear sliding block inserted in said rear support block, and
a fixing member mounted to said rear support block and operable to fix or unfix said second sliding unit relative to said first slide plate; and
said front sliding block and said rear sliding block respectively defining slide recesses to slidably engage said first slide plate.

6. The horizontal probing fixture as claimed in claim 5, wherein said second sliding block module further has
two auxiliary sliding blocks respectively disposed on two sides of said rear sliding block that are opposite in the transverse direction, said auxiliary sliding blocks being inserted in said rear support block; and
a plurality of adjusters extending through said rear support block, said adjusters being operable to move said rear and auxiliary sliding blocks toward said first slide plate.

7. The horizontal probing fixture as claimed in claim 6, wherein said second sliding block module further has three shim plates, said shim plates being disposed between said rear support block and said rear sliding block, and between said rear support block and said auxiliary sliding blocks, said shim plates being respectively pressed by said adjusters against said rear and auxiliary sliding blocks.

8. The horizontal probing fixture as claimed in claim 5, a distance between said front sliding block and said rear sliding block in the longitudinal direction below said first slide plate is greater than a length of each of said first sliding blocks in the longitudinal direction below said first slide plate.

9. The horizontal probing fixture as claimed in claim 5, wherein said fixing member extends through said rear support block and is operable to move said rear sliding block toward said first slide plate.

10. The horizontal probing fixture as claimed in claim 1, wherein said base unit further includes a worktable module that has a first panel and a second panel, said first and second panels being releasably interlocked with each other, one of said first and second panels having a groove, the other one of said first and second panels having a protrusion interlocked with said groove.

\* \* \* \* \*